(12) United States Patent  
Bass, Jr. et al.

(10) Patent No.: US 6,507,930 B1
(45) Date of Patent: Jan. 14, 2003

(54) METHOD AND SYSTEM FOR IMPROVING YIELD OF SEMICONDUCTOR INTEGRATED CIRCUITS

(75) Inventors: Roy Smythe Bass, Jr., Essex Junction, VT (US); Stephen Larry Runyon, Pflugerville, TX (US)

(73) Assignee: International Business Machines Corporation, Armonk, NY (US)

( * ) Notice: Subject to any disclaimer, the term of this patent is extended or adjusted under 35 U.S.C. 154(b) by 83 days.

(21) Appl. No.: 09/608,905

(22) Filed: Jun. 30, 2000

(51) Int. Cl.[7] .............................................. G06F 17/50
(52) U.S. Cl. .............................................. 716/2; 716/1
(58) Field of Search ....................... 716/1–18

(56) References Cited

U.S. PATENT DOCUMENTS

| | | | | |
|---|---|---|---|---|
| 5,267,177 A | * | 11/1993 | Sato et al. ...................... | 716/2 |
| 5,278,105 A | * | 1/1994 | Eden et al. .................. | 438/129 |
| 5,498,579 A | * | 3/1996 | Borodovsky et al. ......... | 716/19 |
| 5,900,340 A | * | 5/1999 | Reich et al. ................... | 430/22 |
| 5,953,518 A | | 9/1999 | Sugasawara et al. | |
| 6,054,721 A | * | 4/2000 | Milor .......................... | 257/48 |

* cited by examiner

*Primary Examiner*—Matthew Smith
*Assistant Examiner*—Sun James Lin
(74) *Attorney, Agent, or Firm*—Casimer K. Salys; Bracewell & Patterson, L.L.P.

(57) ABSTRACT

A method and system are disclosed for improving a yield of circuits produced from a semiconductor wafer. A plurality of design rules are established for designing a layout of the circuit within the wafer. A yield-limiting set of the plurality of design rules are selected. Adherence to each of the set of rules throughout all of the layout reduces the yield. For each one of the set of rules, a recommended value is determined. A percentage of occasions each one of the set should be exceeded within the layout is also determined. The layout is then designed so that each one of the set of the plurality of design rules meets or exceeds the recommended value more often than the percentage.

16 Claims, 4 Drawing Sheets

*Fig. 1*

*Prior Art*

METHOD AND SYSTEM FOR IMPROVING YIELD OF SEMICONDUCTOR INTEGRATED CIRCUITS

BACKGROUND OF THE INVENTION

1. Technical Field

The present invention relates in general to semiconductor circuit design and, in particular, to a system and method for optimizing the yield of circuits produced from a semiconductor wafer. Still more particularly, the present invention relates to a system and method for optimizing the yield of circuits produced from a semiconductor wafer by requiring minimum design rules to be exceeded a particular percentage of occasions within the layout of the circuit.

2. Description of the Related Art

Fabrication of semiconductor integrated circuits (IC's) is an extremely complex process that involves several hundred or more operations. They are fabricated by the use of photo-lithographic processes, in which complex shape patterns are transferred from a masking structure, i.e. a mask, into a photosensitive material, typically photo resist, which is deposited onto the surface of a silicon wafer. The mask image is transferred into the resist by exposing the masked photo resist to light, and then "developing" the resist layer to selectively remove the resist in regions exposed to light.

The image thus transferred into the resist can then be used to locally alter the electrical characteristics of the silicon wafer, i.e. by use as selective blocking layers for ion implantation. Another use of the masking process is for the selective removal of regions in layers of conductive and insulating materials which are deposited sequentially on the silicon wafer. These processes are used to define wiring layers and interconnects between wiring layers in the IC's produced.

Semiconductor IC's are not manufactured individually, but rather as an assembly of many chips on a wafer which is then diced up to produce the individual chips.

Increasing production yield is an ongoing challenge in the manufacture of semiconductor chips. Because of various defects that can occur in the fabrication of a wafer, significant numbers of wafer die have to be discarded for one reason or another, thereby decreasing the percentage yield per wafer and driving up the cost of individual chips. Defects are typically caused by foreign particles, minute scratches, and other imperfections introduced during photoresist, photo-mask, etching, and diffusion operations. Yield loss increases the number of wafer starts at the inception of production needed to meet specific customer order quantities for finished chips at the end of the production line and limits the number of good parts which can be sold.

Virtually all complex integrated circuits are designed with the use of computer aided design tools. Some CAD tools, called simulators, help the circuit designer verify the operation of a proposed circuit. Another type of CAD tool is used for automatic layout. This tool generates the shape patterns used to produce photo masks from a detailed circuit specification. These shape patterns used to produce a set of masks for a particular circuit are commonly called the circuit layout. Other types of circuit layout may be generated manually by a mask layout technician using graphical editing tools.

Circuit layouts are usually comprised of shapes drawn on multiple mask levels and are used to determine the presence of various materials in the semiconductor IC production. For instance, some layers of the circuit layout will define the regions of the semiconductor substrate that are doped with n-type or p-type dopants, while other layers of the circuit layout will define regions in which materials are deposited on the top of the substrate, such as polysilicon or metal regions, while yet other layers will define apertures to be formed in various layers of material so as to form connections between layers of the semiconductor circuit. Each layer of a circuit layout is defined as a set of polygons, or cells.

Figure 1:
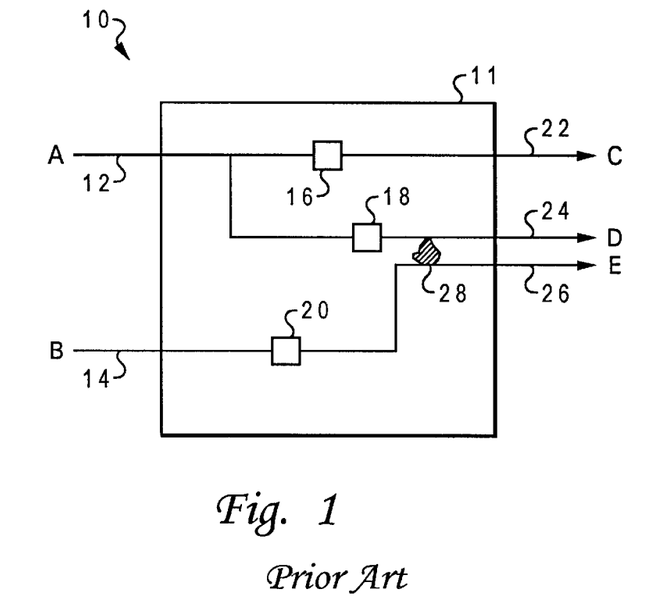
FIG. 1 illustrates an idealized simple layout of a conventional integrated circuit design that includes logic circuits, or cells, and conductive lines in accordance with the prior art.

FIG. 1 illustrates an idealized simple layout of a conventional integrated circuit design 10 that includes logic circuits and conductive lines in accordance with the prior art. A region of interest 11 has a conductive line 12, which provides an input signal "A" to circuits 16 and 18 that generate output signals "C" and "D", which are transmitted through conductive lines 22 and 24, respectively. Similarly, region 11 includes another conductive line 14, which provides another input signal "B" to circuit 20 that generates an output signal "E", which is transmitted through conductive line 26. It should be noted that some or all of the elements of the logic circuits may exist at layers other than the layer on which the conductive lines exist. Conductive line 26 is close enough to conductive line 24 to form an area that is sensitive to a particle, such as particle 28, which is present in this area and in physical contact with conductive lines 26 and 24 and may short-circuit output signals D and E.

The layout design of IC devices, such as metal oxide semiconductor (MOS) transistors, and circuits is constrained by a set of rules called the "minimum design rules" or "ground rules". These rules typically represent the photo-lithographic and process limits of resolution for a given "technology". The rules generally specify minimum sizes, spaces, and overlaps allowed, for and between the various mask layers used in the ultimate production of the semiconductor IC's. Processes are typically designed on the basis of the minimum feature size and space that can be reliably produced for a given mask level.

While design processes for automatic placement of conductive lines provide a minimum separation distance, they do not account for the general need to arrange the conductive lines in such a manner so that the areas which are especially susceptible to defects are minimized. The design rules that dictate the conventional IC layout, are partly guided by the criteria of minimizing overall chip size and maximizing performance. Because the minimum design rules do not account for areas which are especially susceptible to defects, the yield of usable devices produced from a wafer is not maximized.

Further, circuit layouts which are generated manually often may not be optimized for best yield.

Therefore, a need exists for a method and system for improving a number of usable circuits produced from a semiconductor wafer without increasing the area of the circuit or impacting its performance.

SUMMARY OF THE INVENTION

A method and system are disclosed for improving a yield of circuits produced from a semiconductor wafer. A plurality of design rules are established for designing a layout of the circuit within the wafer. A yield-limiting set of the plurality of design rules are selected. Adherence to each of the set of rules throughout all of the layout reduces the yield. For each one of the set of rules, a recommended value is determined. A percentage of occasions each one of the set should be exceeded within the layout is also determined. The layout is then designed so that each one of the set of the plurality of design rules meets or exceeds the recommended value more often than the percentage.

The above as well as additional objectives, features, and advantages of the present invention will become apparent in the following detailed written description.

DESCRIPTION OF THE DRAWINGS

The novel features are set forth in the appended claims. The present invention itself, however, as well as a preferred mode of use, further objectives, and advantages thereof, will best be understood by reference to the following detailed description of a preferred embodiment when read in conjunction with the accompanying drawings, wherein:

DETAILED DESCRIPTION OF A PREFERRED EMBODIMENT

A preferred embodiment of the present invention and its advantages are better understood by referring to FIGS. 1–5 of the drawings, like numerals being used for like and corresponding parts of the accompanying drawings.

The present invention is a method and system for improving the yield of circuits produced from a semiconductor wafer by evaluating and enforcing compliance to a set of recommended design rules. Yield is maximized by requiring that recommended design rules be followed rather than the minimum design rules within the layout of the circuit wherever possible without adversely affecting the area of the circuit or performance.

For any given ground rule, there will be a minimum value. There may also be a value which is larger than the minimum value and which is known to improve yield if met, hereafter called the "recommended value" or "recommended design rule".

In general, there are several types of actions which will improve yield. Three types will be discussed relative to this invention: (1) for any given shape, increasing the width above the minimum ground rule dimension may increase yield, (2) for any two shapes, increasing the spacing above the minimum ground rule dimension may increase yield, and (3) for any two shapes on different layers which are desired to be electrically connected, increasing the number of contact vias by providing redundant contacts or increasing area may improve yield.

A plurality of design rules are established for designing the layout of the circuit within the wafer. These design rules describe a minimum value which must be followed throughout the design in order to satisfy the rule. Some of these design rules may reduce the yield from a wafer if these design rules are strictly followed throughout the design. The design rules which could reduce yield are then defined as "yield-limiting" design rules.

A decision as to whether to include a particular design rule in the set of yield-limiting design rules is based on an analysis of the process yield of previous layouts of circuits in this or previous technologies.

For each of the potentially yield-limiting design rules, a recommended value is established. Thus, a set of recommended design rules are established which includes the recommended value instead of the minimum value for each rule in the set.

A threshold percentage is established. The threshold is the minimum percentage of times the recommend values must be satisfied or exceeded within a circuit layout. A window size may also be established and associated with each design rule. The window size is used to generate a window used when determining whether the minimum design rule is exceeded.

In operation, within each level of the layout, an analysis is made for each yield-limiting design rule. A determination is made as to the number of times the recommended value for each rule is exceeded. In order to make this determination for a particular yield-limiting design rule, a first shape within the level is selected. If the rule is a width rule, then all portions of the shape are checked for the recommended width. If all portions meet this larger width, then the shape is considered "good" and a counter is incremented. Otherwise, the shape is considered to have failed the test.

If a rule is a spacing rule, a window is then created which is the same shape as the selected shape and which extends from the selected shape by the specified window size, or expansion factor, associated with this design rule. All other shapes which are located within the window are then included in the analysis of whether the recommended value for this design rule is exceeded. If all other shapes meet the recommended spacing, the shape under test is considered "good" and a counter is incremented. Otherwise, the shape is considered to have failed the test.

Thereafter, another shape is selected in this level. Similarly, for this second shape, the test as described above are repeated. When all shapes on this level are analyzed using this design rule, a second yield-limiting design rule is selected and the analysis is performed utilizing that rule.

The remaining shapes in each remaining level are also analyzed. After the analysis is completed, a percentage can be calculated for each rule as to the number of times the recommended value for each rule was met. For each rule, the percentage is compared to the threshold established for that rule. If the percentage is greater than or equal to the threshold, the layout passes the yield check. If the percentage is less than the threshold, the layout fails the check and should be redesigned so that the recommended values are met or exceeded within the layout a greater percentage of times than the threshold. This will then improve the yield.

Figure 2:
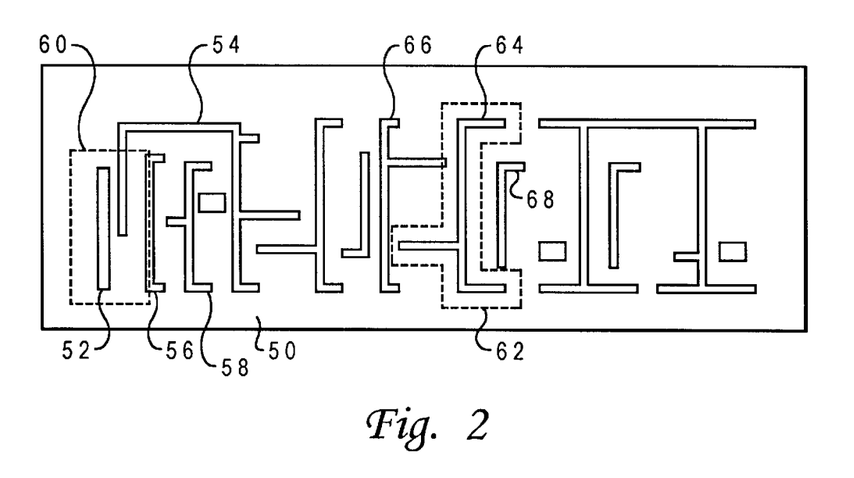
FIG. 2 depicts a detailed view of conductive shapes including a window for analyzing a portion of the layout in accordance with the method and system of the present invention.

FIG. 2 depicts a detailed view of conductive shapes including a window in one level of a circuit design for analyzing a portion of the layout in accordance with the method and system of the present invention. One level 50 of a wafer is depicted. Several conductive shapes are illustrated within level 50. For example, shapes 52, 54, 56, and 58 are depicted. In addition a window 60 is illustrated. In accordance with the present invention, each shape in level 50 will be analyzed using all of the specified design rules. Some of these design rules could cause a limitation of yield, and hence are called yield-limiting design rules. When each shape is analyzed using the recommended design rules, a determination is made regarding whether the recommended rule is met. A percentage of occasions that the recommended design rule is met is then determined.

In order to properly determine the number of times the recommended value for a yield-limiting design rule is met, a window is created around each shape as it is analyzed. For example, when shape 52 is being analyzed using each of the yield-limiting design rules, a window 60 is created around shape 52. Window 60 is the same shape as shape 52 and extends from shape 52 according to a specified window size, or expansion factor. For each design rule a window size is specified. Generally, a window is generated only for spacing rules. The window size is made as large as possible, but is limited by the consideration of not falsely giving credit to two unrelated shapes. For example, two wires which are one millimeter apart should not be given credit for meeting the recommended rule because they are totally unrelated. Therefore, window 60 may extend, as an example, two microns from shape 52 in all directions. Selecting a particular window size is dependent on the particular manufacturing process used to produce the circuit, and may be determined by considering past performance of circuits manufactured with the particular process.

In accordance with the present invention, when shape 52 is analyzed using one of the yield-limiting design rules, window 60 is generated, the size of which is associated with this rule. As shown in FIG. 2, shapes 54 and 56 are included within window 60. Therefore, shapes 54 and 56 are included in the analysis of this design rule using shape 52.

As another example, window 62 is generated when shape 64 is analyzed utilizing one of the design rules. Shape 66 is located within window 62. If the size of window 62 is associated with a spacing rule, the spacing between shape 64 and 66 is analyzed. Other shapes located in this level, such as shape 68, are not included in the analysis.

Figure 3:
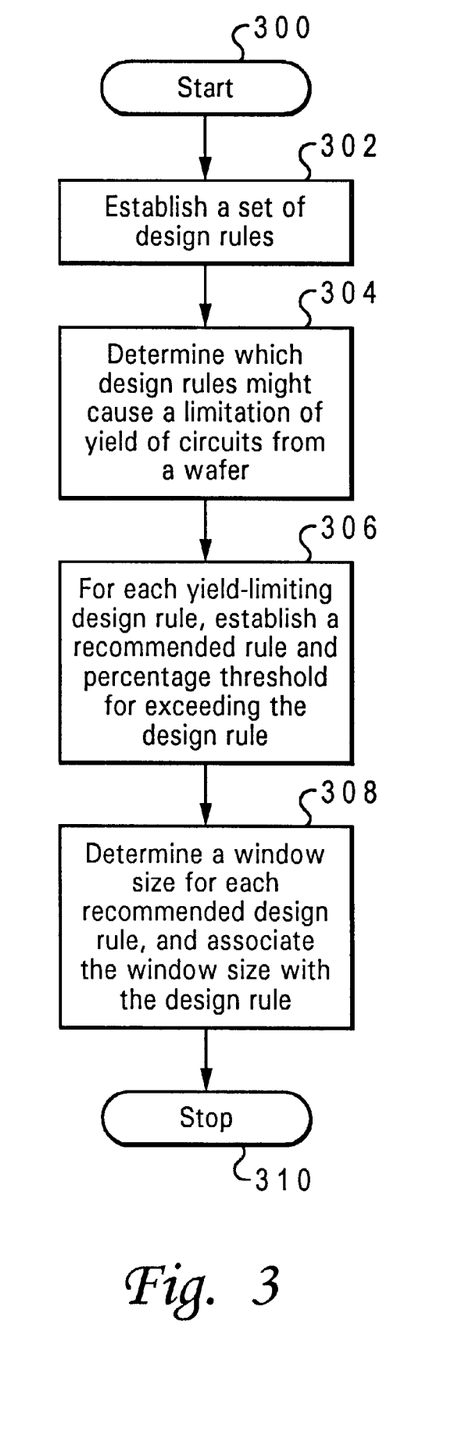
FIG. 3 illustrates a high level flow chart which depicts selecting yield-limiting design rules, and establishing recommended rules, a threshold, and window size for each of these rules in accordance with the method and system of the present invention.

FIG. 3 illustrates a high level flow chart which depicts selecting yield-limiting design rules, and establishing recommended rules, a threshold, and window size for each of these rules in accordance with the method and system of the present invention. The process starts as depicted at block 300 and thereafter passes to block 302 which illustrates establishing a set of design rules to use when designing a layout for a circuit. Next, block 304 depicts a determination of a set of these design rules which could cause a limitation of the yield of circuits produced from a wafer. These design rules are called "yield-limiting" design rules. Particular design rules are selected to be included in this set as potentially yield-limiting design rules based on the past performance of circuits. Failed parts are analyzed to determine the failure mechanism. A list of the probability of different types of failures is generated and maintained. Electrical defect monitors are also included in the design to help generate yield statistics.

Thereafter, block 306 illustrates establishing a recommended value and a threshold percentage for each of these yield-limiting design rules. A recommended design rule is the recommended value for the yield-limiting design rule. The threshold is a minimum percentage of times the recommended value for the yield-limiting design rule associated with the threshold must be exceeded within a circuit in order to maximize the yield. For example, a minimum design rule might require a width of 0.5 microns between wires of the circuit. The recommended value for this design rule may be 0.7 microns. Therefore, the minimum design rule is 0.5 microns between wires, while the recommended design rule is 0.7 microns between wires. If, while analyzing a particular wire, the width is determined to be greater than 0.7 microns, this yield-limiting design rule is exceeded. The threshold might specify a requirement that the width be exceeded in 50% of the measurements which are taken in the circuit.

The process then passes to block 308 which depicts a determination of a window size for each yield-limiting design rule. The window size is then associated with that design rule. A window is utilized during the analysis of the circuit in determining whether the recommended value for the design rule requirement is exceeded. Only those shapes within the window are included in the analysis at a particular time. All shapes outside of the window are ignored. For example, a first shape to be analyzed may be selected. A window is then defined which surrounds the first shape, and extends out from the first shape in all directions to the specified window size. Thus, a window is specified and located over the first shape. The window is the same shape as the first shape. All other shapes which are within this window are then included within the analysis. After the first shape is analyzed, another shape is selected. Another window is then specified located over this second shape in a manner as described above. Block 308 depicts specifying a window size for each yield-limiting rule to be utilized when specifying a window when analyzing a shape utilizing the rule. The process then terminates as illustrated by block 310.

Figure 4:
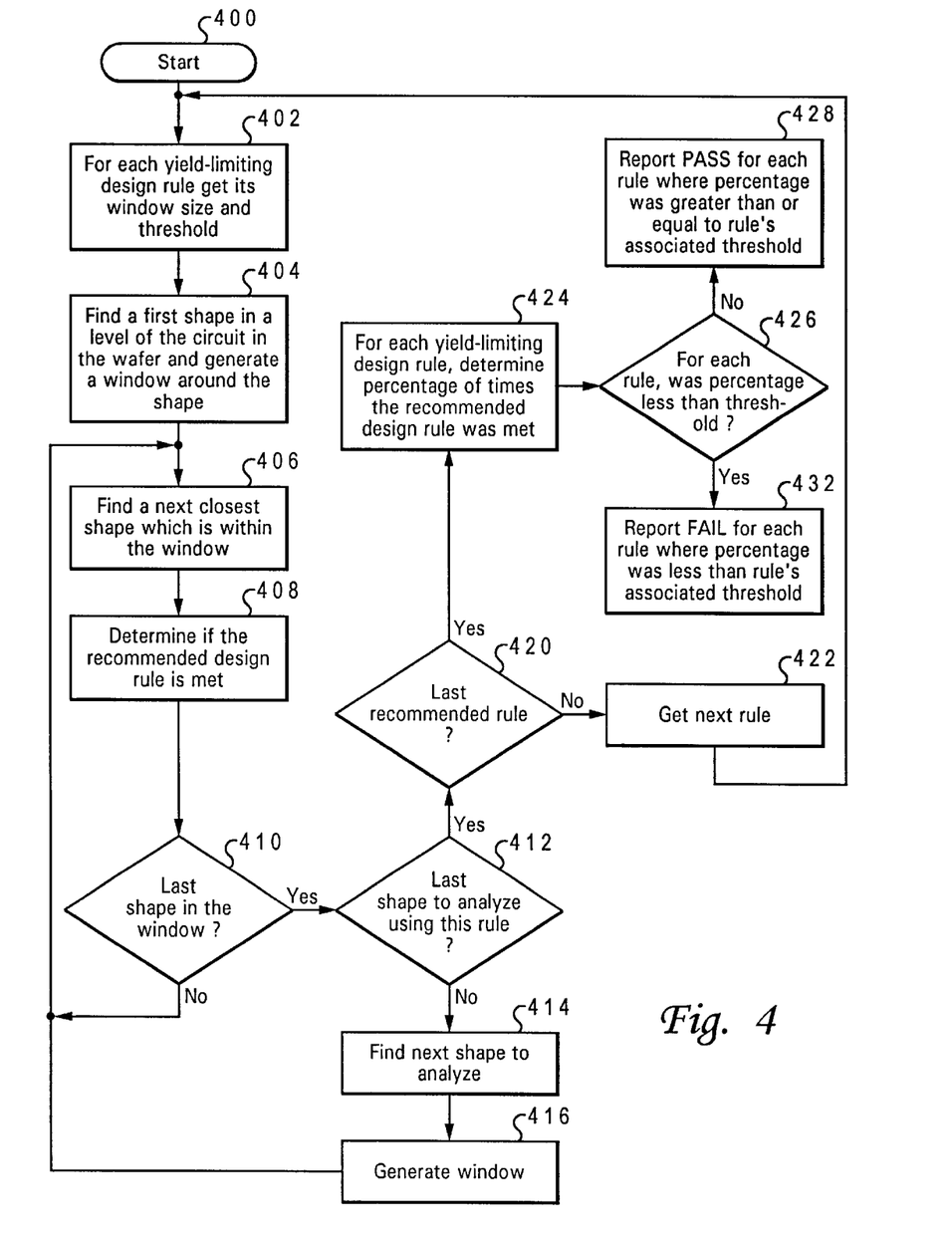
FIG. 4 depicts a high level flow chart which depicts analyzing a circuit layout in accordance with the method and system of the present invention.

FIG. 4 depicts a high level flow chart which depicts analyzing a circuit layout in accordance with the method and system of the present invention. The following process describes one method for implementing the present invention. Those skilled in the art will recognize that other methods may be utilized to achieve the same result.

The process starts as depicted by block 400 and thereafter passes to block 402 which illustrates retrieving the window size and threshold associated with a first yield-limiting design rule. Thereafter, block 404 depicts finding a first shape in a first level of the circuit in the wafer to analyze, and generating a window around the shape. The window will be the same shape as the first shape, and could be expanded from the first shape by the window size which is associated with this rule. The process then passes to block 406 which depicts finding a next closest shape which is at least partly within the window created over the first shape. Block 408, then, illustrates a determination of whether or not the recommended requirement for the design rule is exceeded. For design rules which define a minimum width requirement, only the first shape is used in the analysis. The next closest shape in the window is not needed. For design rules which define a minimum spacing requirement, both shapes are used in the analysis.

Next, block 410 depicts a determination of whether or not this is the last shape in the window. If a determination is made that other shapes are included in the window, the process passes back to block 406 so that each remaining shape can be used along with the first shape in the order to analyze whether the recommended design rule has been met. Referring again to block 410, if a determination is made that no other shape exists in the window, the process passes to block 412 which illustrates a determination of whether or not this is the last shape to analyze using this design rule. If a determination is made that this is not the last shape to analyze using this design rule, the process passes to block 414 which depicts getting a next shape to analyze. The process then passes to block 416 which illustrates the generation of a window around the shape. The process then passes back to block 406.

Referring again to block 412, if a determination is made that no more shapes exist which should be analyzed with this design rule, the process passes to block 420 which illustrates a determination of whether or not this is the last recommended design rule to use to analyze the circuit layout. If a determination is made that this is not the last recommended design rule to use to analyze the circuit layout, the process passes to block 422 which depicts getting the next design rule. The process then passes back to block 402.

Referring again to block 420, if a determination is made that this is the last recommended design rule to use to analyze the circuit layout, the process passes to block 424 which illustrates for each of the yield-limiting design rules, determining the percentage of times the recommended design rule was met. The process then passes to block 426 which depicts a determination of whether or not, for each of the yield-limiting design rules, the percentage was less than the threshold associated with each rule. For each of the yield-limiting design rules, if a determination is made that the percentage is greater than or equal to the rule's associated threshold, the process passes to block 428 which illustrates reporting a PASS for the rule.

Referring again to block 426, if a determination is made that the percentage is less than the rule's associated threshold, the process passes to block 432 which illustrates reporting a FAIL for the rule. When a FAIL is reported, it is an indication to the designer that the current circuit layout does not meet the design requirements and must be redesigned so that the percentage of times the recommended values are met or exceeded is greater than the threshold.

Figure 5:
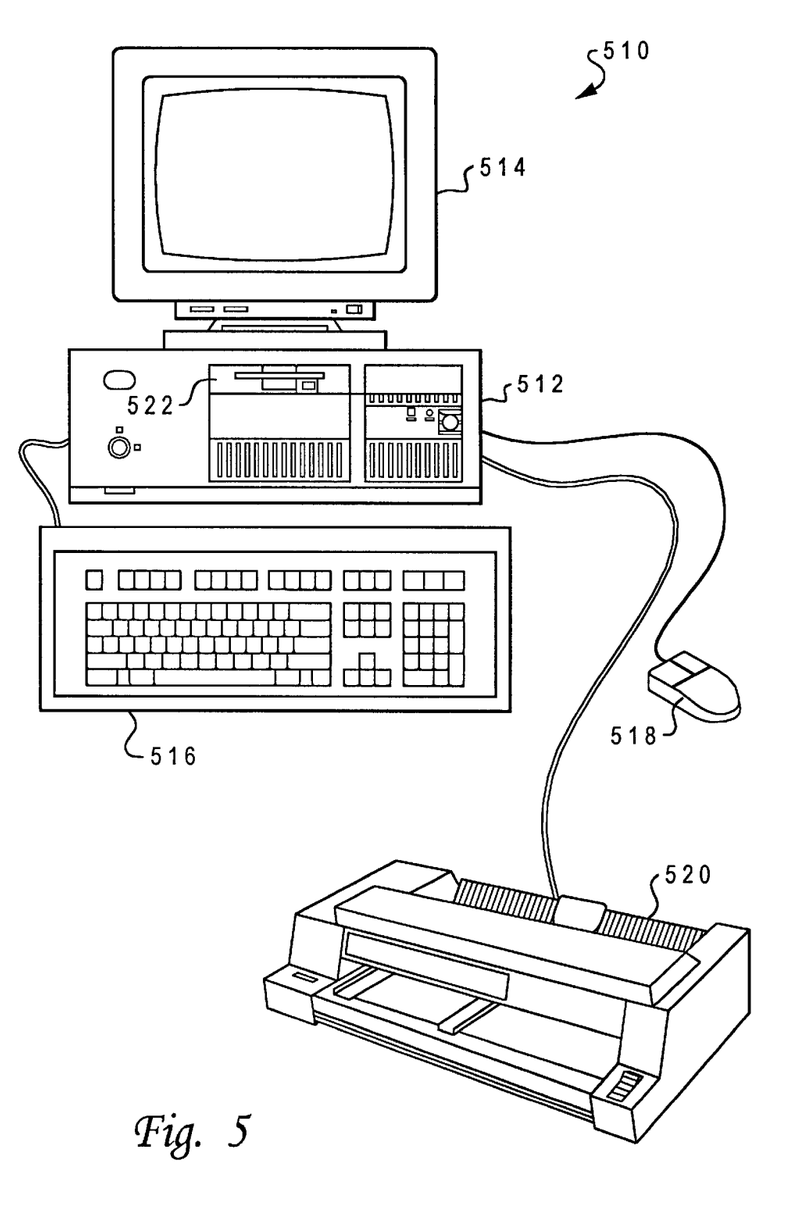
FIG. 5 illustrates a pictorial representation of a data processing system which may be used to implement the present invention.

FIG. 5 illustrates a pictorial representation of a data processing system 510 which may be used to implement the present invention. Computer system 510 includes a computer 512, a monitor 514, a keyboard 516, a mouse 518, a printer 520, and a floppy drive 522. Computer system 510 is capable of receiving a variety of different types of inputs from a variety of different types of input devices. Keyboard 516 and mouse 518 are two such types of input devices. Computer system 510 may be implemented utilizing any commercially available computer system.

While a preferred embodiment has been particularly shown and described, it will be understood by those skilled in the art that various changes in form and detail may be made therein without departing from the spirit and scope of the present invention.

What is claimed is:

1. A method for improving a yield of circuits produced from a semiconductor wafer, said method comprising the steps of:

establishing a plurality of design rules for designing a layout of said circuit within said wafer;

selecting a yield-limiting set of said plurality of design rules, wherein adherence to each of said yield-limiting set of said plurality of design rules throughout all of said layout reduces a yield from said wafer;

for each one of said yield-limiting set of said plurality of design rules, determining a recommended value exceeding a corresponding yield-limiting design rule, said recommended value describing a number of redundant vias between different layers in said semiconductor wafer;

determining a percentage of occasions each said recommended value should be met within said layout; and designing said layout so that each said recommended value is met at least as often as said percentage of occasions.

2. The method according to claim 1, further comprising the steps of:

selecting a first shape within said circuit to analyze;

determining whether each said recommended value is met within said first shape; and utilizing said determination for said first shape to determine said percentage of occasions each said recommended value should be met within said layout.

3. The method according to claim 1, further comprising the steps of:

generating a window for analyzing a first shape; and determining whether said recommended value for each one of said yield-limiting set of said plurality of design rules is met utilizing said first shape and other shapes at least partially located within said window, wherein said first shape and said other shapes which are at least partially located within said window are utilized in said determination.

4. The method according to claim 3, further comprising the steps of:

specifying an expansion factor to utilize to generate said window; and generating said window around said first shape utilizing said expansion factor, said window extending outward from said first shape in all directions by said expansion factor, wherein said window is the same shape as said first shape.

5. The method according to claim 4, further comprising the step of specifying an expansion factor for each of said yield-limiting set of said plurality of design rules, wherein said specified expansion factor is associated with each of said yield-limiting set of said plurality of design rules.

6. A system for improving a yield of circuits produced from a semiconductor wafer, comprising:

means for establishing a plurality of design rules for designing a layout of said circuit within said wafer;

means for selecting a yield-limiting set of said plurality of design rules, wherein adherence to each of said yield-limiting set of said plurality of design rules throughout all of said layout reduces a yield from said wafer;

means, for each one of said yield-limiting set of said plurality of design rules, for determining a recommended value exceeding a corresponding yield-limiting design rule;

means for determining a percentage of occasions each said recommended value should be met within said layout, said recommended value describing a number of redundant vias between different layers in said semiconductor wafer; and means for designing said layout so that each said recommended value is met at least as often as said percentage of occasions.

7. The system according to claim 6, further comprising:

means for selecting a first shape within said circuit to analyze;

means for determining whether each said recommended value is met within said first shape; and means for utilizing said determination for said first shape to determine said percentage of occasions each said recommended value should be met within said layout.

8. The system according to claim 6, further comprising:

means for generating a window for analyzing a first shape; and means for determining whether said recommended value for each one of said yield-limiting set of said plurality of design rules is met utilizing said first shape and other shapes at least partially located within said window, wherein said first shape and said other shapes which are at least partially located within said window are utilized in said determination.

9. The system according to claim 8, further comprising:
means for specifying an expansion factor to utilize to generate said window; and
means for generating said window around said first shape utilizing said expansion factor, said window extending outward from said first shape in all directions by said expansion factor, wherein said window is the same shape as said first shape.

10. The system according to claim 9, further comprising means for specifying an expansion factor for each of said yield-limiting set of said plurality of design rules, wherein said specified expansion factor is associated with each of said yield-limiting set of said plurality of design rules.

11. The method according to claim 1, wherein said recommended value describes a width of a conductive element in said semiconductor wafer.

12. The method according to claim 1, wherein said recommended value describes a spacing between at least two conductive elements in said semiconductor wafer.

13. The system according to claim 6, wherein said recommended value describes a width of a conductive element in said semiconductor wafer.

14. The system according to claim 6, wherein said recommended value describes a spacing between at least two conductive elements in said semiconductor wafer.

15. The method according to claim 1, wherein said recommended value is determined from a list of failures generated from an analysis of failures of sad semiconductor wafer when using said yield-limiting set of said plurality of design rules.

16. The system according to claim 6, wherein said recommended value is determined from a list of failures generated from an analysis of failures of said semiconductor wafer when using said yield-limiting set of said plurality of design rules.

* * * * *

UNITED STATES PATENT AND TRADEMARK OFFICE
CERTIFICATE OF CORRECTION

PATENT NO.    : 6,507,930 B1
DATED         : January 14, 2003
INVENTOR(S)   : Roy Smythe Bass, Jr. and Stephen Larry Runyon It is certified that error appears in the above-identified patent and that said Letters Patent is hereby corrected as shown below:

Column 10,
Line 12, please replace "generated from an analysis of failures of sad semiconductor" with -- generated from an analysis of failures of said semiconductor --.

Signed and Sealed this

Ninth Day of September, 2003

JAMES E. ROGAN
*Director of the United States Patent and Trademark Office*